(12) United States Patent
Kuo et al.

(10) Patent No.: US 7,685,487 B1
(45) Date of Patent: Mar. 23, 2010

(54) SIMULTANEOUS CORE TESTING IN MULTI-CORE INTEGRATED CIRCUITS

(75) Inventors: Ting-Yu Kuo, Fremont, CA (US); Dwight K. Elvey, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 772 days.

(21) Appl. No.: 11/086,924

(22) Filed: Mar. 22, 2005

(51) Int. Cl.
*G01R 31/28* (2006.01)

(52) U.S. Cl. .................................................... 714/726

(58) Field of Classification Search ....................... None
See application file for complete search history.

(56) References Cited

U.S. PATENT DOCUMENTS

| | | | | |
|---|---|---|---|---|
| 5,592,493 | A * | 1/1997 | Crouch et al. ............... | 714/729 |
| 5,606,566 | A * | 2/1997 | Whetsel ...................... | 714/729 |
| 5,734,615 | A * | 3/1998 | Dierke ......................... | 365/201 |
| 6,249,893 | B1 | 6/2001 | Rajsuman et al. .......... | 714/741 |
| 6,430,718 | B1 * | 8/2002 | Nayak ......................... | 714/727 |
| 6,560,739 | B1 * | 5/2003 | Chung ........................ | 714/726 |
| 6,594,802 | B1 * | 7/2003 | Ricchetti et al. ............ | 716/4 |
| 6,686,759 | B1 | 2/2004 | Swamy | |
| 6,815,973 | B1 | 11/2004 | Conn | |
| 6,886,121 | B2 * | 4/2005 | Dervisoglu et al. ......... | 714/726 |
| 7,032,141 | B2 * | 4/2006 | Tanizaki ..................... | 714/718 |
| 2003/0018944 | A1 | 1/2003 | Chae et al. | |
| 2003/0046622 | A1 * | 3/2003 | Whetsel ...................... | 714/724 |
| 2004/0168105 | A1 * | 8/2004 | Haroun et al. .............. | 714/30 |
| 2004/0260990 | A1 * | 12/2004 | Saxena et al. .............. | 714/726 |
| 2005/0055617 | A1 * | 3/2005 | Wang et al. ................. | 714/727 |
| 2006/0064613 | A1 * | 3/2006 | Whetsel ...................... | 714/724 |
| 2006/0075316 | A1 * | 4/2006 | Chindamo et al. .......... | 714/726 |

OTHER PUBLICATIONS

International Search Report and Written Opinion for PCT/US2006/010233, mailed Jul. 14, 2006, 10 pages.

* cited by examiner

*Primary Examiner*—Kevin L Ellis
*Assistant Examiner*—Guerrier Merant
(74) *Attorney, Agent, or Firm*—Rory D. Rankin; Meyertons Hood Kivlin Kowert & Goetzel, P.C.

(57) ABSTRACT

Various embodiments of methods and systems for simultaneously testing multiple cores included in an integrated circuit are disclosed. In one embodiment, an integrated circuit may include two or more logic cores. The IC may also include structural scan test hardware coupled to the cores. This structural scan test hardware may be capable of inputting scan test vector data into scan registers associated with each of the logic cores, simultaneously executing a scan test on the logic cores included in the IC, and outputting the results of the scan tests for multiple cores to automated test equipment (ATE) simultaneously. In one embodiment, elements of the results of testing for multiple cores may be interleaved on a single output line such that an element of test result data from each core is present on an input channel to the ATE during each strobe window.

30 Claims, 14 Drawing Sheets

| CT_n-1 | CT_n-2 | ... | CT_1 | Sel_n-1 | Sel_n-2 | ... | Sel_1 | Scan_out |
|---|---|---|---|---|---|---|---|---|
| 0 | 0 | | 0 | 0 | 0 | | 0 | Serial mode for Core 1 |
| 0 | 0 | | 0 | 0 | 0 | | 1 | Serial mode for Core 2 |
| | | ⋮ | | | | ⋮ | ⋮ | |
| 0 | 0 | | x | 0 | 1 | | x | Serial mode for Core n-1 |
| 0 | x | | x | 1 | x | | x | Serial mode for Core n |
| 0 | 0 | | 1 | 0 | 0 | | x | Concurrent TDM test mode for Core 1 and Core 2 |
| | | ⋮ | | | | ⋮ | ⋮ | |
| 0 | 1 | | 0 | 0 | x | | 0 | Concurrent TDM test mode for Core 1 and Core n-1 |
| 0 | 1 | | 0 | 0 | x | | 1 | Concurrent TDM test mode for Core 2 and Core n-1 |
| 1 | 0 | | 0 | x | 0 | | 0 | Concurrent TDM test mode for Core 1 and Core n |
| 1 | 0 | | 0 | x | 0 | | 1 | Concurrent TDM test mode for Core 2 and Core n |
| 1 | 0 | | x | x | 1 | | x | Concurrent TDM test mode for Core n-1 and Core n |
| | | | | | | | | all other states are illegal |

FIGURE 9

SIMULTANEOUS CORE TESTING IN MULTI-CORE INTEGRATED CIRCUITS

BACKGROUND OF THE INVENTION

1. Field of the Invention

This invention is related to the field of integrated circuit testing, and more particularly, to structural testing of multi-core integrated circuits, such as multi-core microprocessors.

2. Description of the Related Art

ICs of low to moderate complexity may typically be tested using functional tests. In some cases test vectors may be developed to exercise all of the functional characteristics of the specific IC and used in manufacturing to validate each unit. Many ICs, such as chip multiprocessors (CMP) may be too complex for this approach, and the collection of functional test vectors that would be required for functional testing may be much too large for available automated test equipment (ATE).

Most ICs comprise a collection of independent or quasi-independent functional blocks and in some instances it may be more efficient to test each block separately, rather than testing the chip as a whole. This test method is called structural testing, because it tests whether circuit structures have been correctly manufactured. In order to perform structural testing on an IC, the facility may input the appropriate test vectors to the structural block that is to be tested and obtain the resulting output. New structures may need to be inserted into the IC specifically to support testing, for example MUXD or LSSD scan cells.

Structural tests may attempt to verify that all structural blocks and the interconnections between blocks are manufactured properly. Using a gate-level representation of the design, an automated test pattern generator (ATPG) may algorithmically calculate stimulus for controllable nodes such that the internal design structures may be tested. The complexity and size of designs may make "controlling" and "observing" each structure exceedingly difficult. Two test methodologies; "scan testing" and "random testing" may be selected depending upon the exact nature of the design to be tested.

In full scan testing, storage elements within the device under test (DUT) may be connected together into one or more scan chains. The ATPG patterns may be stored in the tester memory of the ATE. The ATE may output the vectors into the circuit using a number of parallel scan chains. Factors such as availability of chip I/O pins, availability of tester channels, and on-chip routing congestion caused by chaining storage elements in test mode may place a limit on the number of scan chains which can be used.

The random test methodology applies random (or pseudo-random) data values to the design-input nodes, to exercise each structure in the design (in effect, randomly controlling and observing them). This method may yield better results when testing regular structures, such as memories. The quality of pseudorandom patterns may be increased with the custom design of LFSRs (linear-feedback shift registers) and phase shifters. Desired segments of the available random pattern space may be generated by loading the LFSR with specific seeds from which to start pattern generation. A MISR (multiple-input signature register) may be used to capture the responses to the random patterns.

However, some designs may unsuitable for testing using random patterns. For these designs, test points may need to be inserted to improve controllability and observability of internal structures. In the BIST (built-in-self-test) methodology for logic, the LFSR and MISR may become part of the chip itself. BIST may implement a full-scan methodology to apply random pattern data to each logic structure. This architecture may allow for many more parallel scan chains, because they no longer have to be routed to chip I/O pins.

Typically, logic BIST uses scan technology as its base. A PRPG (pseudo-random pattern generator) replaces a deterministic ATPG to generate the test patterns. The test patterns may be input through the scan chains and the core logic, and an MISR (multiple-input signature register) may be used to collect the responses. All circuitry required for the PRPGs and the MISRs may be embedded on the chip. Embedded test-pattern generation and response-analysis may require little memory on the ATE.

One of the greatest virtues of BIST may be its ability to run test patterns at the rated functional speed of the chip under test, which may be crucial for time-sensitive designs. Because both test-pattern generation and response-analysis functions reside on the chip, the ATE is only required to trigger the test and therefore, its limitations may not constrain test execution. However, the amount of additional hardware added to the chip to perform a comprehensive BIST may be prohibitive.

Some complex ICs may be designed to include multiple copies of a functional block or core. For example a multi-core microprocessor may include multiple copies of a complex general-purpose processing core where each core functions independently, or nearly independently of the other cores. Traditionally, structural tests have been designed to test each core separately. Due to pin limitations, only one core may be tested at a time.

SUMMARY

Various embodiments of methods and systems for simultaneously testing multiple cores included in an integrated circuit are disclosed. In one embodiment, an integrated circuit may include two or more logic cores. The IC may also include structural scan test hardware coupled to the cores. This structural scan test hardware may be capable of inputting scan test vector data into scan registers associated with each of the logic cores, simultaneously executing a scan test on the logic cores included in the IC, and outputting the results of the scan tests for multiple cores to automated test equipment (ATE) simultaneously. In one embodiment, elements of the results of testing for multiple cores may be time-division multiplexed on a single output line such that an element of test result data from each core is present on an input channel to the ATE during each strobe window.

In one embodiment, the IC may include one or more hardware functions other than the multiple logic cores and the structural scan test hardware. For example the IC may include a communications controller and/or memory controller along with the cores and test hardware. In some embodiments, the cores may be x86 processor cores and the communications controller and/or memory controller may provide a mechanism through which the cores may access main or system memory. During test execution the other hardware functions may be tested simultaneously with the cores in some embodiments, while in others they may be tested non-concurrently. In one embodiment the other functions may be placed into a mode in which they do not interact or interact only minimally with the cores during test execution. In this way the effects of the operation of the other functions on the test results of the cores may be minimized or eliminated. In other embodiments, the results of test segments in which the operation of the other functions influences the core results may be ignored by the ATE.

In some embodiments, the structural scan test hardware may include a test mode selector. The test mode selector may select between various versions of both concurrent and non-concurrent testing to determine the mode in which testing is conducted for the cores. For example in some non-concurrent modes, only one core may be tested at a time and therefore only test results from a single core may be available after each test execution. In other cases, a test may be executed on each core simultaneously, and a single set of combined test results output per test execution.

In some concurrent test modes, the results from the cores may be compared internally by the structural scan test hardware to determine the consensus thereof and output an indication. For example, if an IC includes two cores and the result for a particular element of the test are the same, a first logic level may be output to the ATE to indicate the agreement of the results. In instances in which the results for a particular element of the test differ, a second logic level may be output to the ATE to indicate that one of the cores may have executed the test element incorrectly.

In other concurrent test modes, the results from the cores may be time-division multiplexed onto an output line and input into a channel of the ATE. For example if the IC includes two cores, the two values for the test results from each core for a particular test element may be sent to the ATE on a single channel in a period in which only a single value from one core would be transmitted under other test modes. This time-division multiplexing of test result elements may allow an element from each core to be input to the ATE on a single channel during a strobe window. The ATE may compare the test result elements from each core to an expected value stored in ATE memory during the strobe window. Any element that does not compare with the expected result may indicate that one of the cores executed that particular test element erroneously.

BRIEF DESCRIPTION OF THE DRAWINGS

A better understanding of the present invention can be obtained when the following detailed description is considered in conjunction with the following drawings, in which:

FIG. 9 is a truth table illustrating the required states for the control lines for an embodiment as illustrated in FIG. 8 in order to activate a particular serial or concurrent TDM test mode for any core or core pair.

Figure 1:
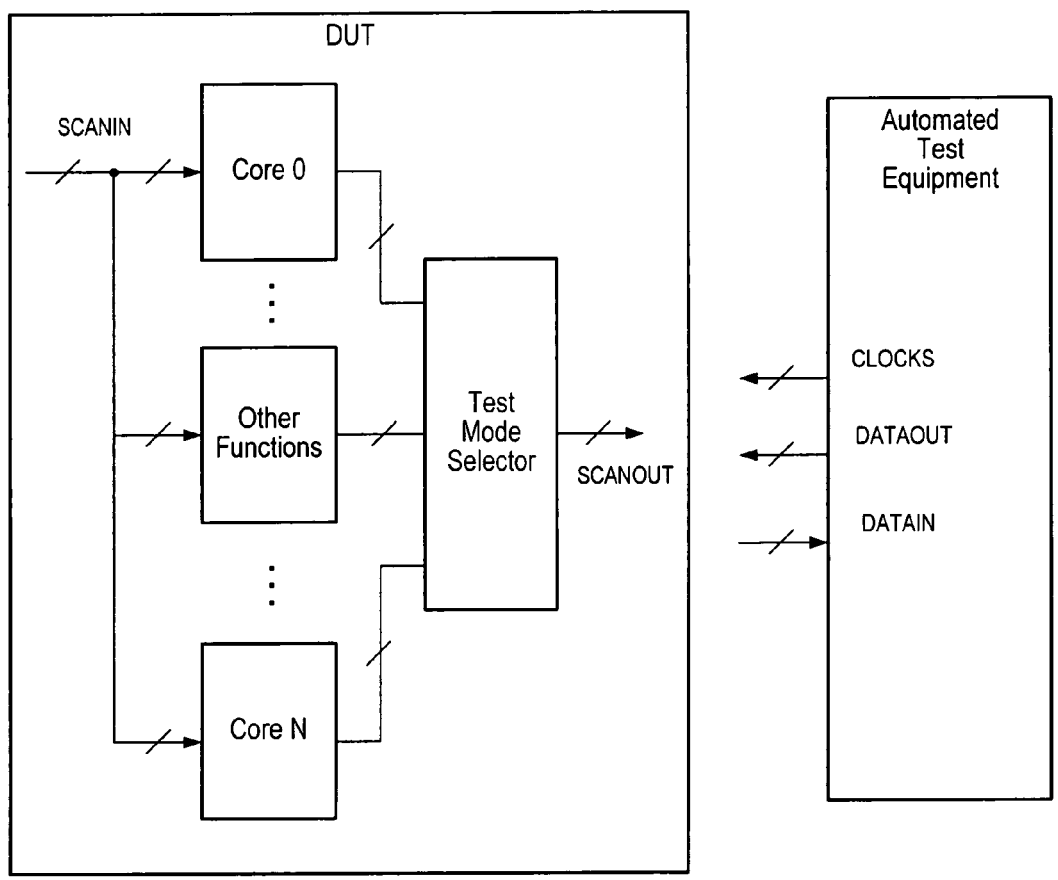
FIG. 1 illustrates a system for testing an integrated circuit including multiple logic cores, according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION OF EMBODIMENTS

FIG. 1 illustrates a system for testing an integrated circuit including multiple logic cores, according to one embodiment. In one embodiment, the device under test (DUT) may be a chip multi-processor and cores 0-N may be identical. The DUT may also include other circuitry not included in the cores. For example, the DUT may include a bridging and/or memory control function, which may allow the cores to access a common memory or other resources. In some cases, the basic core that is replicated in the multi-core DUT may have been included in a previously developed, single-core IC. For example, a microprocessor chip including only the core 0 and other functions blocks of the DUT may have been previously produced and tested using the automated test equipment (ATE) shown in FIG. 1. In such cases, it may be desirable to test the DUT using the ATE used to test the previous IC with minimal changes to hardware and software, and with no increase in test pattern volume or testing time.

In one embodiment the DUT may be an x86 or other type of microprocessor, the cores may be x86 or other type cores, and the other functions may include a communications controller and/or memory controller. During test execution the other functions may be tested simultaneously with the cores in some embodiments, while in others they may be tested non-concurrently. In one embodiment the other functions may be placed into a mode in which they do not interact or interact only minimally with the cores during test execution. In this way the effects of the operation of the other functions on the test results of the cores may be minimized or eliminated. In other embodiments, the results of test segments in which the operation of the other functions influences the core results may be ignored by the ATE. The test mode selector may be used to select the test mode in which a given test is executed and to route the appropriate test results to the ATE.

The ATE may be designed to output scan test data to the DUT on the DATAOUT lines and clock this data into the DUT on its SCANIN lines using one or more of clock signals. These clock signals may be used to control the MUXI and/or LSSD cells included in the cores and other functions as scan chains. In one embodiment, one or more clocks generated by the ATE may be input to the test mode selector. The test mode selector may select between various versions of both concurrent and non-concurrent testing to determine the mode in which testing is conducted. One function of the test mode selector may be to route outputs from the cores and other functions to the DUT SCANOUT lines. The selected outputs may be input to the ATE on the DATAIN lines and compared with expected results stored in ATE memory to determine whether faults exist within the DUT.

Figure 2:
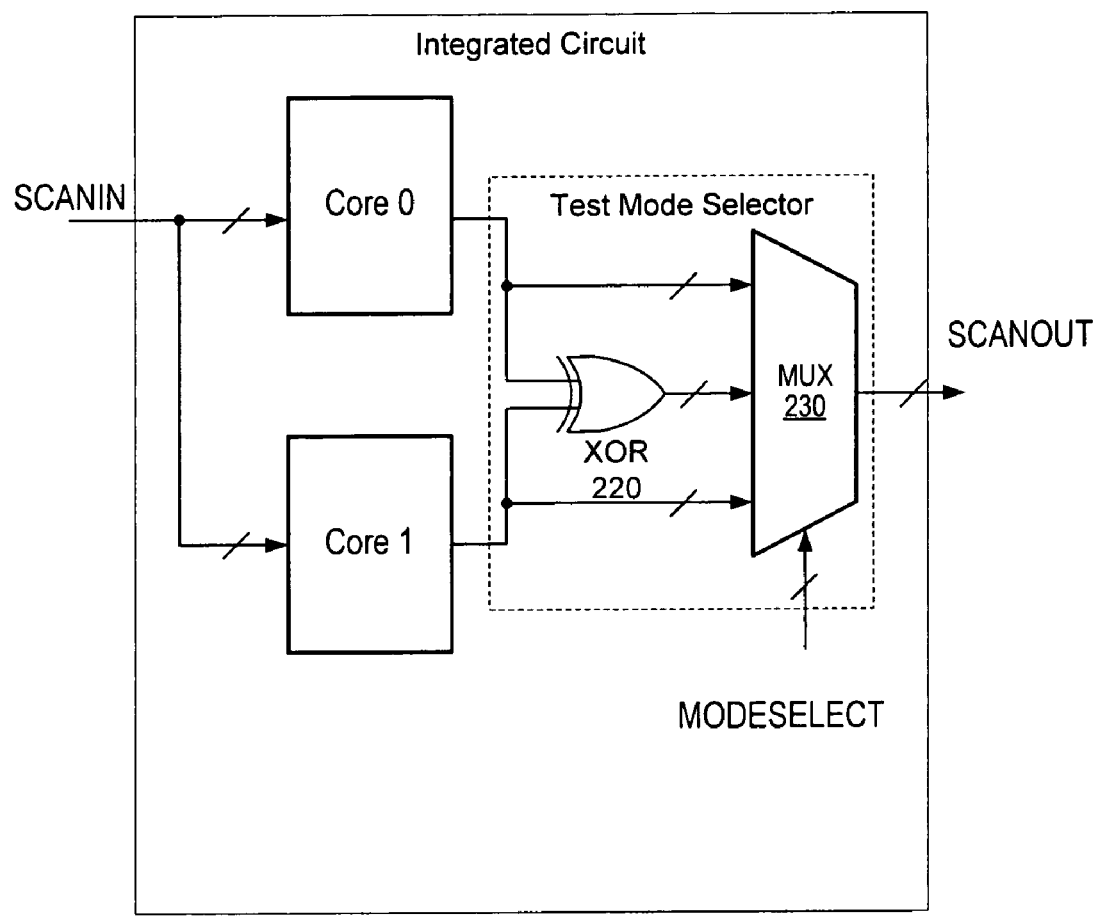
FIG. 2 illustrates one embodiment of a multi-core IC configured to select between multiple modes of structural testing including a simultaneous or concurrent mode, according to one embodiment.

FIG. 2 illustrates one embodiment of a multi-core IC configured to select between multiple modes of structural testing including a simultaneous or concurrent mode, according to one embodiment. Although for simplicity only two cores are depicted and the other functions are omitted, the described embodiments may be extended to the testing of ICs with any number of cores and hardware to support various other functions. XOR function 220 and MUX function 230 may be components of the test mode selector of FIG. 1. The mode selector may be controlled by the state of the MODESELECT lines as described below. The state of the MODESELECT lines may be controlled by registers in test logic included in the DUT in some embodiments, while in others the state may be controlled by other test circuitry or inputs.

In preparation for testing, test vectors may by loaded from the ATE into the scan chains of the DUT using the SCANIN lines. When the loading of the test vectors is complete, the values of the MODESELECT lines may determine the mode in which testing is executed. For example, if the MUX 230 is set to select the output of either core 0 or core 1, a non-concurrent or serial test mode may be activated. During test execution, one or more clock signals, including a system clock signal may be applied to the logic cores, and the results of the test for the selected core may be available as the outputs of scan chains through the SCANOUT lines. By selecting the outputs of the scan chains for a particular core using the MODESELECT signals controlling MUX 230, the test results for that core may be routed to the ATE. The ATE may compare the output test results to expected results stored in ATE memory during each system clock cycle, and indicate an error condition when the actual and expected results differ. When the testing of one core is complete, test vectors with different values for the MODESELECT signals may be input to the DUT. By changing the values of the mode select signals, the output of another core may be routed to the ATE and the test re-run to obtain test results for that core.

The embodiment of FIG. 2 may also be able to select from one or more concurrent or simultaneous modes of testing. In a concurrent test mode, two or more cores which may be identical or testable using a single set of test vectors, may be tested simultaneously using the same input test vectors. By setting the MODESELECT signals to couple the output of the XOR function 220 through MUX 230 to the SCANOUT line, the concurrent mode of core testing may be selected. In this mode as in the non-concurrent mode, test vectors may by loaded into the scan chains of each of the cores via the SCANIN line. When the system clock is applied to the cores, test results may be available from designated scan chains for each core. In order for the ATE to evaluate the results of the testing of both cores simultaneously, the outputs of the scan chains for both cores may be input to XOR or other comparison function 220 and its output routed to the SCANOUT lines. In effect, this configuration may compare the test results from core 0 and core 1 against each other and output an error indication when there is disagreement. This concept may be extended to the testing of more than two cores simultaneously by routing the test result outputs of each core into comparison logic that outputs a first level when all inputs are the same, and a different level when any input differs from any other input. However, core fault conditions in which each core produces the incorrect result for a given test may be aliased using this methodology.

In an alternative embodiment, the expected results may be input to registers whose outputs are available to comparators added to the chip to support testing. During test execution, the test results from each core may be compared to the expected results within the DUT. The comparison outputs may remain at a low level so long as the actual and expected results are in agreement, and switch to a high level only in the case of disagreement. The results comparison outputs may be ORed together to form the SCANTOUT signal to the ATE. The ATE may interpret any high level on the SCANOUT line as a fault of one or more of the cores without the possibility of aliasing described with regard to the previous embodiment.

Figure 3:
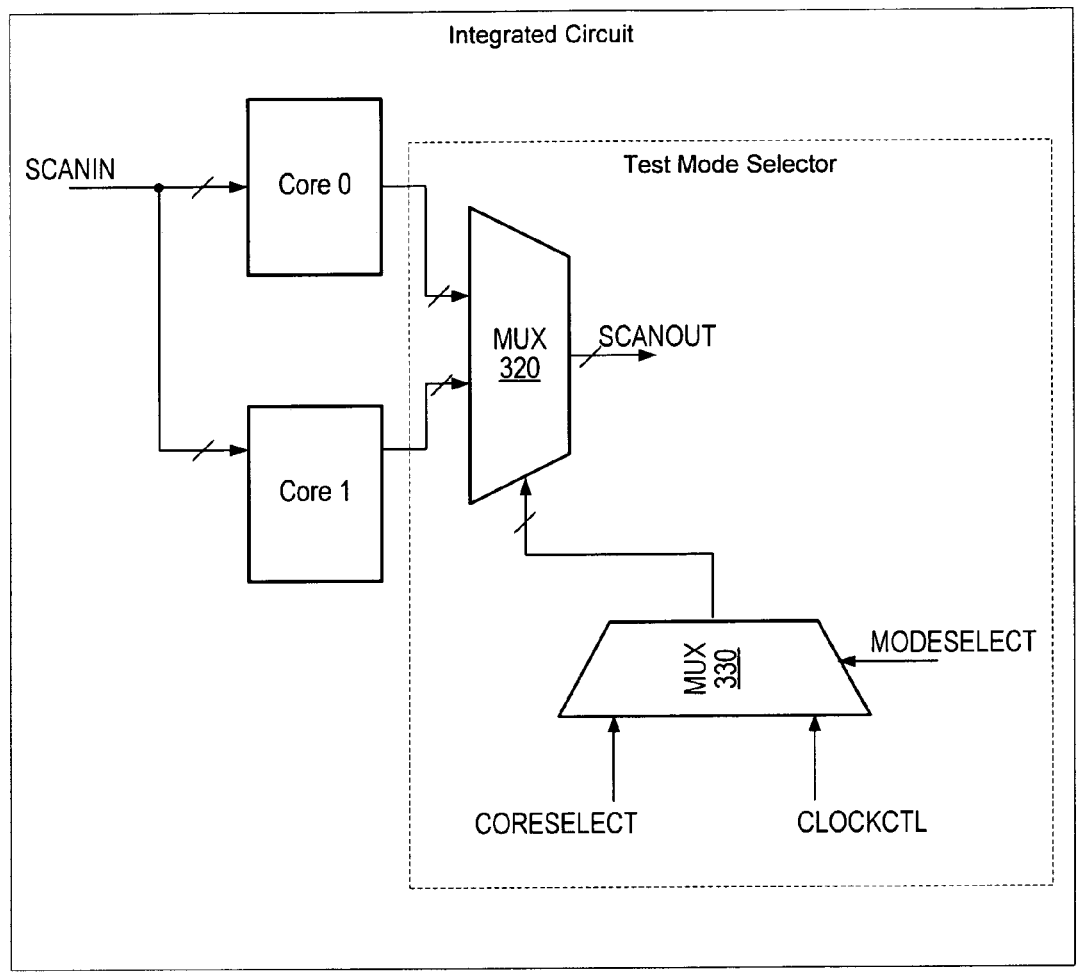
FIG. 3 illustrates another embodiment of a multi-core IC configured to select between multiple modes of structural scan testing including a concurrent mode, which test the cores and time-division multiplexes the test results, according to one embodiment.

FIG. 3 illustrates another embodiment of a multi-core IC configured to select between multiple modes of structural scan testing including a concurrent mode, which test the cores and time-division multiplexes the test results, according to one embodiment. Although for simplicity only two cores are depicted and the other functions are omitted, the described embodiments may be extended to the testing of ICs with any number of cores or core pairs along with hardware to support various other functions. MUX functions 320 and 330 may be components of the test mode selector of FIG. 1.

In the embodiment of FIG. 3, non-concurrent mode may be selected by setting the mode select lines to feed the CORESELECT signal through MUX 330 to the select input of MUX 320. The state of the core select signal then may determine whether the test results form core 0 or core 1 are routed to SCANOUT. As in the embodiment of FIG. 2, the results routed to the SCANOUT lines may be sent to the ATE and there analyzed for fault indications. MUX 330 may also route a switching signal to the select input of MUX 320. This may cause the outputs from cores 0 and 1 to be time-division multiplexed onto the SCANOUT lines as described in detail below.

Figure 4:
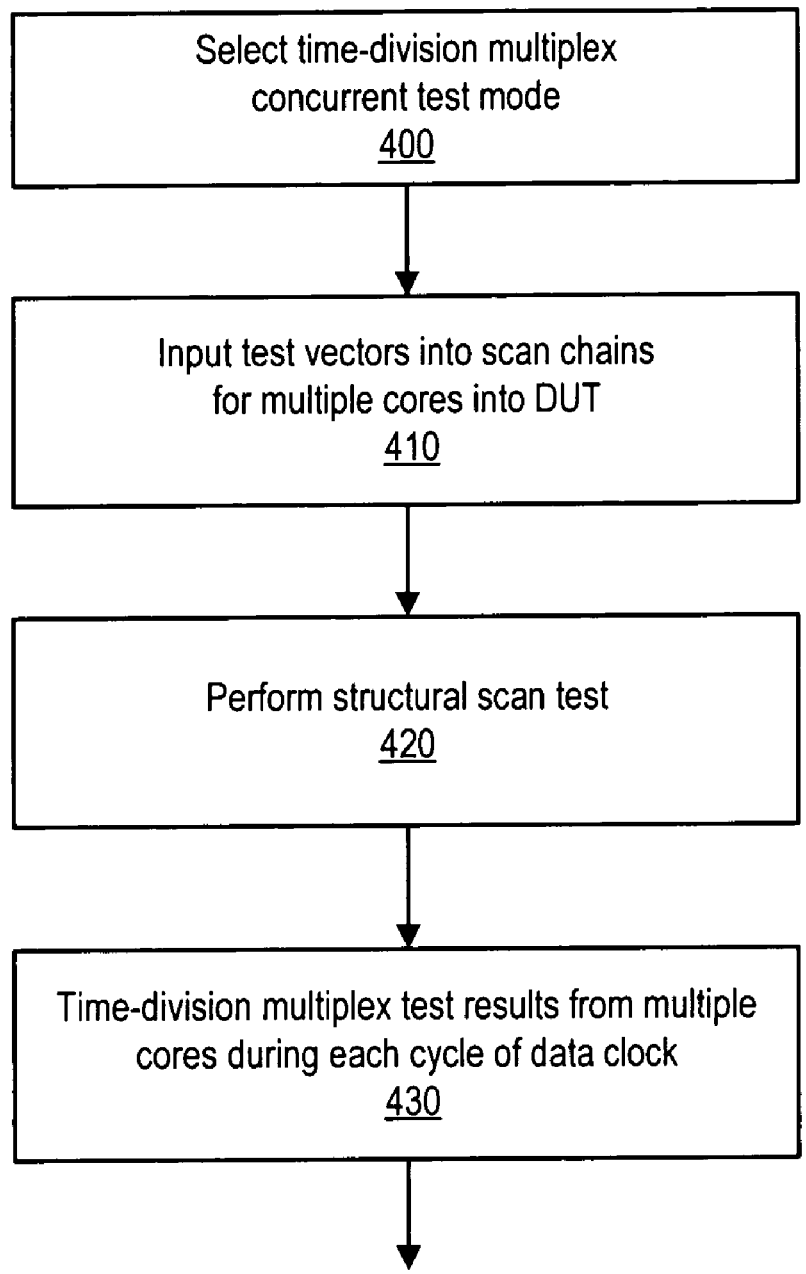
FIG. 4 is a flowchart of a method for testing the DUT embodied in FIG. 3 in simultaneous or concurrent mode, according to one embodiment.

FIG. 4 is a flowchart of a method for testing the DUT embodied in FIG. 3 in simultaneous or concurrent mode. In some embodiments, test data may include values for registers that output the MODESELECT and CORESELECT signals. Inputting this data into the DUT may select the test mode, as illustrated in block 400. When it is desired to perform the testing of both cores concurrently, the data for the test vectors may be clocked into the scan chains of the DUT using the data clock signal from the ATE, as shown in block 410. The MODESELECT signal may be set to route the CLOCKCTL signal through MUX 330 to the select input of MUX 320. This may select the time-division multiplexing (TDM) concurrent test mode. In one embodiment, the CLOCKCTL signal may be a derivative of the data clock signal generated by the ATE used to clock vectors into and out of the cores. In another embodiment, CLOCKCTL may be derived from the system clock signal used to perform the testing. The CLOCKCTL signal may be generated by the ATE and input to the DUT.

During testing, one or more cycles of a system clock generated by the ATE may be applied to the cores, and in some embodiments, other functions within the DUT, as indicated in block 420. The values clocked into the scan chains prior to test execution may be operated on by the hardware and resulting values may be latched into output chains. In concurrent mode, cores may operate on identical input data simultaneously. Upon the conclusion of test execution the test results may be clocked out of the DUT and into the ATE for analysis. When receiving the results from testing the DUT in TDM concurrent test mode, the ATE may be operated in window mode. In window mode, the ATE may compare the input from the DUT to an expected test result value over a period of time referred to as a strobe window, and generate an error signal if the input differs from the expected value at any time during the strobe window. A strobe window may occur once during each cycle of the data clock.

In order to compare the data from more than one core during each data clock cycle, the test result from the cores may be time-division multiplexed onto the SCANOUT lines, as shown in block 430. The CLOCKCTL signal may be derived from the ATE data clock signal such that the falling edge occurs at or near the middle of the strobe window. This may cause MUX 320 to output the results from core 0 during a first portion of the strobe window and the results from core 1 during a second portion of the strobe window. Each of the SCANOUT lines may be connected to a single input channel of the ATE. The time-division multiplexed result data input on each ATE channel may be compared to expected results stored in the ATE memory. During a given strobe window (cycle of CLOCK), if the results from either core 0 or core 1 are not the same as the expected results the ATE may determine that a fault is present in one of the cores. In other embodiments, the results from three or more cores may be time-division multiplexed during the strobe window.

Figure 5:
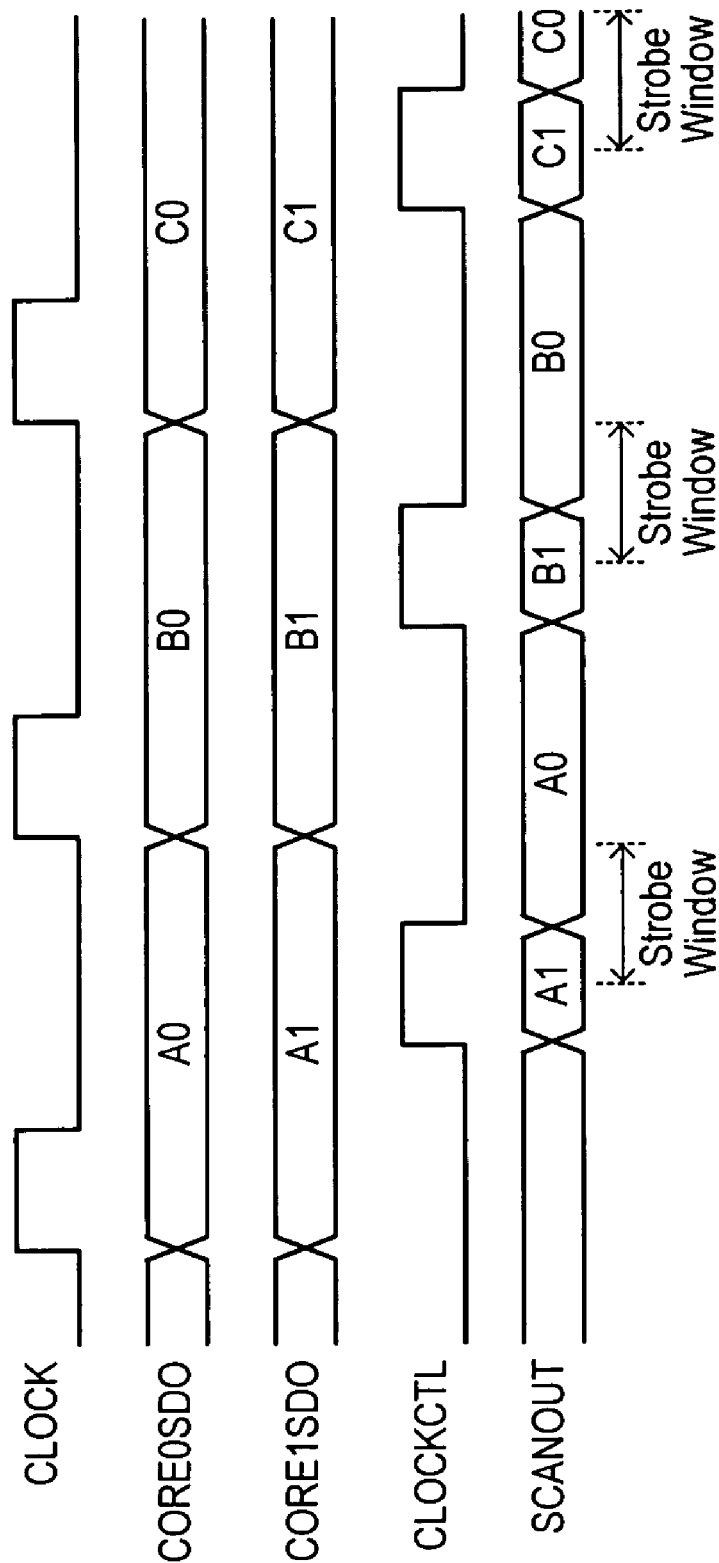
FIG. 5 is a timing diagram illustrating the relationships among several structural scan test signals, according to one embodiment.

FIG. 5 is a timing diagram illustrating the relationships among several structural scan test signals, according to one embodiment. The CLOCK signal may be the data clock generated by the ATE and input to the DUT to control the loading of test vectors into scan chains prior to test execution and the retrieval of test results from the DUT post test. CORE0SDO may be the output from the final structural scan cell in a core0 scan chain. Likewise, CORE1SDO may be the output from the final structural scan cell in a core1 scan chain. Note that the change in these output states may coincide with the rising edge of the CLOCK signal and may become valid/stable a short settling time thereafter. The strobe window may be "open" for some period of time during each CLOCK cycle prior to its rising edge. CLOCKCTL may be derived from CLOCK such that its falling edge occurs within the strobe window and in one embodiment, preferably in the center of the strobe window. This concept may be applied to scan chains including cells of the MUXD or LSSD types, for example.

Referring again to FIG. 3, with CLOCKCTL routed through MUX 330 to the select input of MUX 320 the output of the scan chains of core0 and core1 may be routed through MUX 320 to SCANOUT alternately according to the level of CLOCKCTL. With an edge of the CLOCKCTL signal occurring within the strobe window, both the test results from core0 and core1 may be input to the ATE within a single strobe window period. This is shown in the lower portion of the timing diagram of FIG. 5. Note that during consecutive strobe windows the outputs of the scan chains of both cores are present in the SCANOUT signal. During the first strobe window, the result of test segment A for core 0 (A0) and the result of test segment A for core 1 (A1) may be applied to the ATE input, while during the second strobe window B0 and B1 may be present. Likewise in the third strobe window C0 and C1 may be input to the ATE, etc. Note that in FIG. 3 the result for a test segment for core 1 is shown at SCANOUT as being output in a first portion of the strobe window and the result for a test segment for core 0 is shown as being output in a second portion of the strobe window. In other embodiments this order may be reversed. In embodiments having more than two cores, other orders of time-division multiplexing of results in a strobe window may be used.

During each strobe window, each of the values on the channel may be compared to the expected result for that portion of the test. If the ATE detects a difference between the SCANOUT input and the expected test result at any point during the strobe window, it may generate an error indication associated with that particular test segment. Because the test results from both cores are compared to the expected test results rather than to each other during each CLOCK cycle, an error indication may be generated even when both cored fail the same test segment in the same manner. This may eliminate the fault aliasing associated with the previously described concurrent methodology wherein core test results are compared to one another. In one embodiment, this time-division multiplexing of core test results during the ATE strobe window may be extended to the simultaneous testing of N cores by providing output selection circuitry feeding the SCANOUT line that is configured to alternate the N outputs from the scan chains of the N cores during each strobe window.

Figure 6:
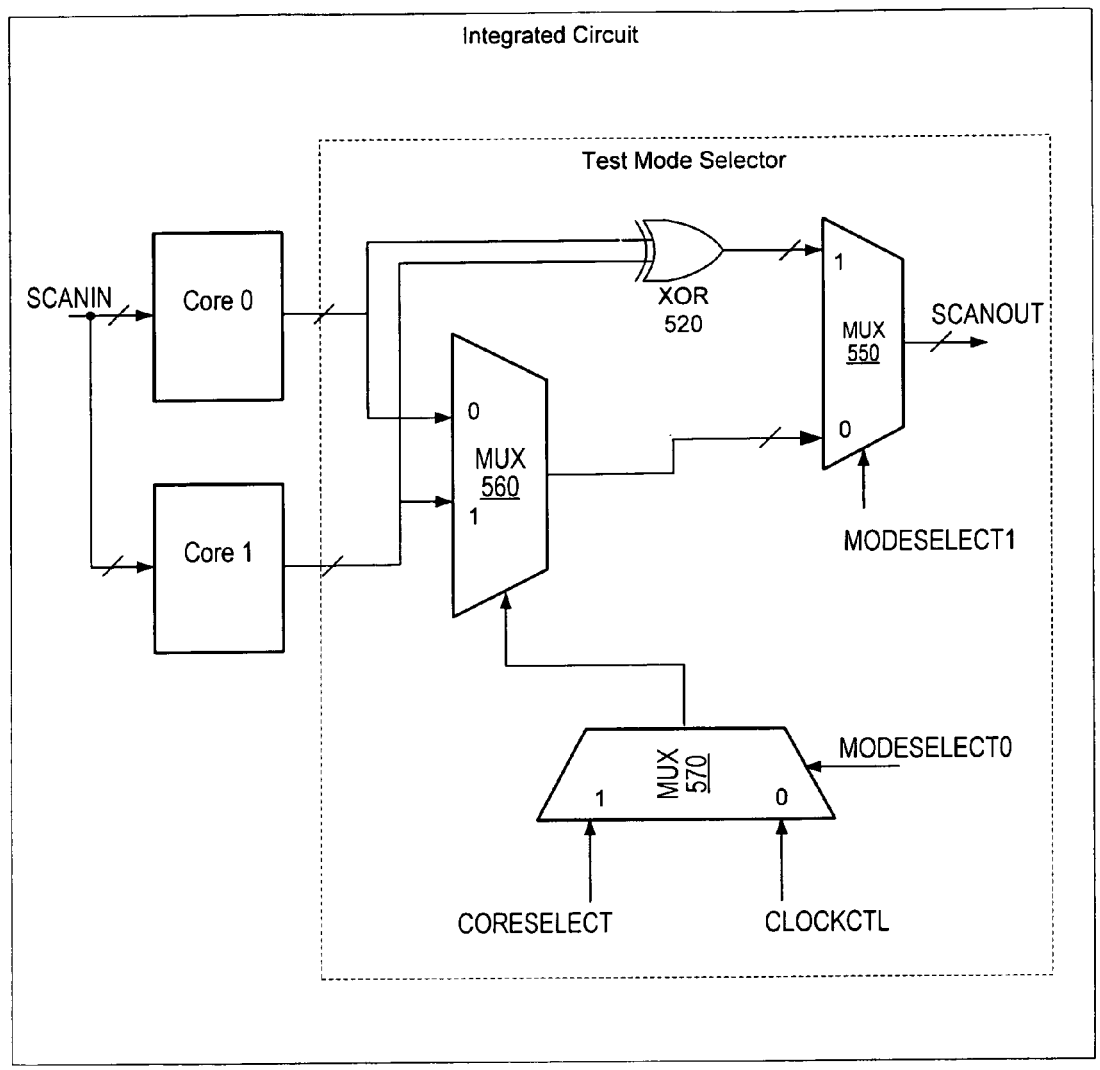
FIG. 6 illustrates one embodiment of a multi-core IC configured to select between multiple modes of structural scan testing including multiple concurrent modes.
Figure 7:
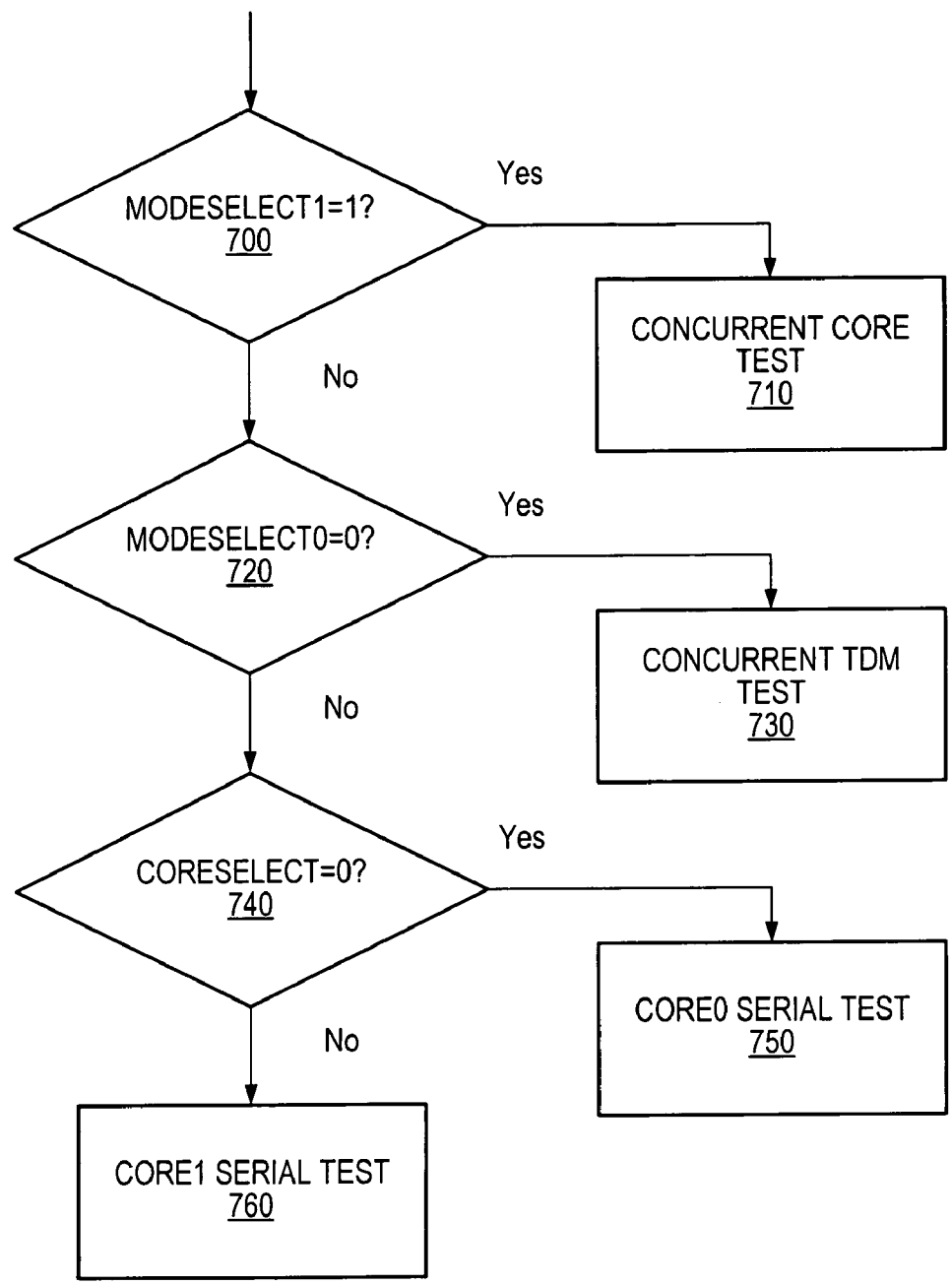
FIG. 7 is a flowchart of a method for configuring the test mode selector circuitry of the embodiment of FIG. 6 to select among several structural scan test modes, according to one embodiment.

FIG. 6 illustrates one embodiment of a multi-core IC configured to select between multiple modes of structural scan testing including multiple concurrent modes. In this embodiment, the circuitry to combine the test modes described with respect to FIGS. 2-4 may be implemented is a single multi-core IC. FIG. 7 is a flowchart of a method for configuring the test mode selector circuitry of the embodiment of FIG. 6 to select among several structural scan test modes, according to one embodiment.

At decision block 700, if MODESELECT1 is set to a high level, the output of the XOR gate 520 may be routed through MUX 550 to the SCANOUT line. In this configuration, the testing of cores 0 and 1 may be carried out concurrently as described with regard to FIG. 2 and indicated by block 710. The SCANOUT signal may assume a high level when the test results of core 0 differ from those of core 1.

When MODESELECT1 is set to a low level, the output of MUX 560 may be routed through MUX 550 to the SCANOUT line. The output of MUX 560 may be either the input from the final scan cell of the core 0 string or the core 1 string depending upon the output of MUX 570 as illustrated in FIG. 6. The output of MUX 570 may in turn depend upon the state of the MODESELECT0 signal as represented in decision block 720 of FIG. 7. When the MODESELECT0 signal is at a low level, the CLOCKCTL input to MUX570 may be routed to the select input of MUX 560. The CLOCKCTL signal, as described in detail previously, may be derived from the ATE-generated CLOCK signal such that the test results from cores 0 and 1 are time-division multiplexed. Both test results may appear at the output of MUX 560 and therefore on the SCANOUT line during the strobe window period of the ATE. Therefore, when both mode select lines are low, simultaneous, time-division multiplexed, scan test mode may be selected, as indicated in block 730.

In the case where the MODESELECT0 signal is at a high level, the non-concurrent or serial test mode may be selected in which the test results from one or the other of the cores is routed to the SCANOUT signal line. Referring once again to FIG. 6, the CORESELECT signal is routed through MUX 570 to the select input of MUX 560, which chooses the output from the scan chains of either core 0 or core 1 to be sent through MUXs 560 and 550 to become SCANOUT. This selection may be represented in FIG. 7 by decision block 740. When the CORESELECT signal is low, the IC may be configured to test core 0 in serial test mode, as shown in block 750. Likewise, when the CORESELECT signal is high, the IC may be configured to test core 1 in serial test mode, as shown in block 770. Note that the control levels for the MUXs shown in FIG. 6 may differ from the illustrated embodiment. For example, in another embodiment a high level for MODESELECT0 may select the TDM mode. Other equivalent logic may be used in other embodiments.

Figure 8:
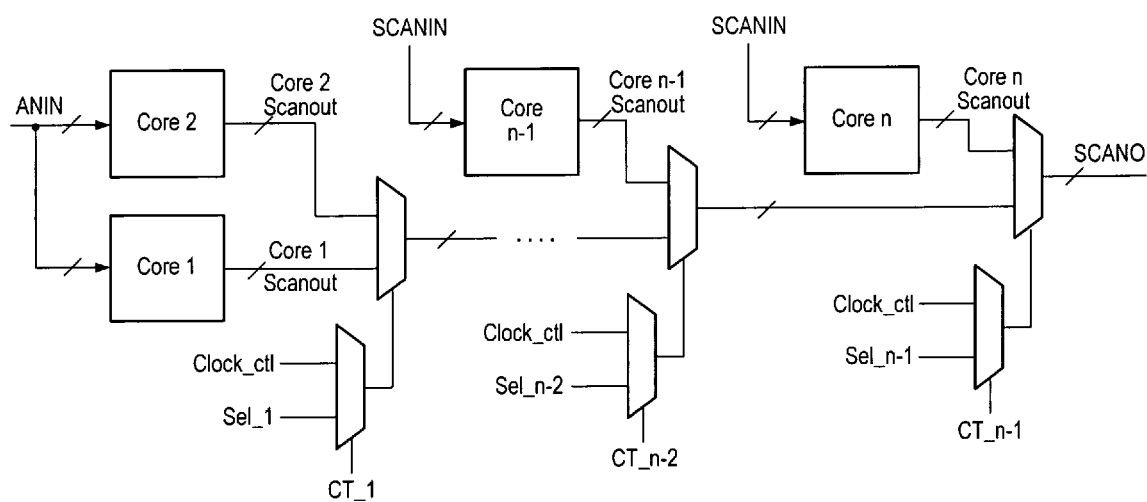
FIG. 8 illustrates one embodiment of a multi-core IC configured to select between multiple modes of structural scan testing including concurrent TDM testing of any pair of cores.

FIG. 8 illustrates one embodiment of a multi-core IC configured to select between multiple modes of structural scan testing including concurrent TDM testing of any pair of cores. Each stage of test mode selection logic may function analogously to the embodiment of FIG. 3 with the output from any particular stage serving as one "core" input to the subsequent stage. For example, the output of the stage including core n−1 may provide the second "core input" for the stage including core n. FIG. 9 is a truth table illustrating the required states for the CT and Sel lines in order to activate a particular serial or concurrent TDM test mode for any core or core pair. The CT lines are analogous to the MODESELECT line of FIG. 3. In order to describe in detail the selection of particular test modes, several examples will be presented below.

To active the non-concurrent or serial test mode for core 1, the CT line for each stage may be set to a low level to route the Sel signals through the lower multiplexers to the select inputs of the upper multiplexers, as shown in FIG. 8. Correspondingly, the first row of the table of FIG. 9 indicates that the all CT signals must be set to 0. The Sel lines in each stage except the first, may be set low to block the output from the core for that stage and allow the output from the previous stage to pass through the upper multiplexers, and ultimately to SCANOUT. Again, the first row of the table of FIG. 9 indicates that the all Sel signals must be set to 0 for this test mode. Since the output of core 1 happens to be the lower input to the upper multiplexer of stage 1, Sel_1 may also be set low to route the test results form core 1 to SCANOUT. Therefore, the first row of the table of FIG. 9 indicates that the all signals must be set to 0 to activate the serial boundary scan test mode for core 1.

If it is desired to activate the serial test mode for a particular core j, the CT_j-1 line may be set low to route Sel_j-1 to the upper multiplexer of the stage including core j. Sel_j-1 may be set high to select the output of core j to be routed to SCANOUT. This is indicated in the table of FIG. 9 by a 1 in the column for Sel_j-1 and 0s in the Sel and CT columns for subsequent stages. Note that since the outputs from previous stages are blocked by the upper multiplexer, the CT and Sel setting for those stages appear as a "don't care", represented by x in the truth table.

In order to activate concurrent TDM test mode for a specific pair of cores, the Clock_ctl signal may be routed to the select input of the upper multiplexer of the stage which includes the higher numbered core. For example, if were desired to test cores 2 and 6, the Clock_ctl signal may be routed to the select input of the upper multiplexer of the stage that includes core 6. This allows the output of the higher numbered core to be time-division multiplexed with the output from the previous stages. This is indicated in the table of FIG. 9 by a 1 in the column corresponding to the CT line for the higher numbered core. Also, the output of the lower numbered core must be routed to input of the stage of the higher numbered core by setting its corresponding Sel line high and routing it to the select input of the upper multiplexer for stage including the lower numbered core. This is indicated in the table of FIG. 9 by a 1 in the column corresponding to the Sel line for the lower numbered core. Note core 1 is an exceptional case and its corresponding Sel line may be set low. As in the previous example, the outputs from stages prior to that including the lower numbered core are blocked and therefore the CT and Sel setting for those stages may appear as a "don't care", represented by x in the truth table.

Figure 10A:
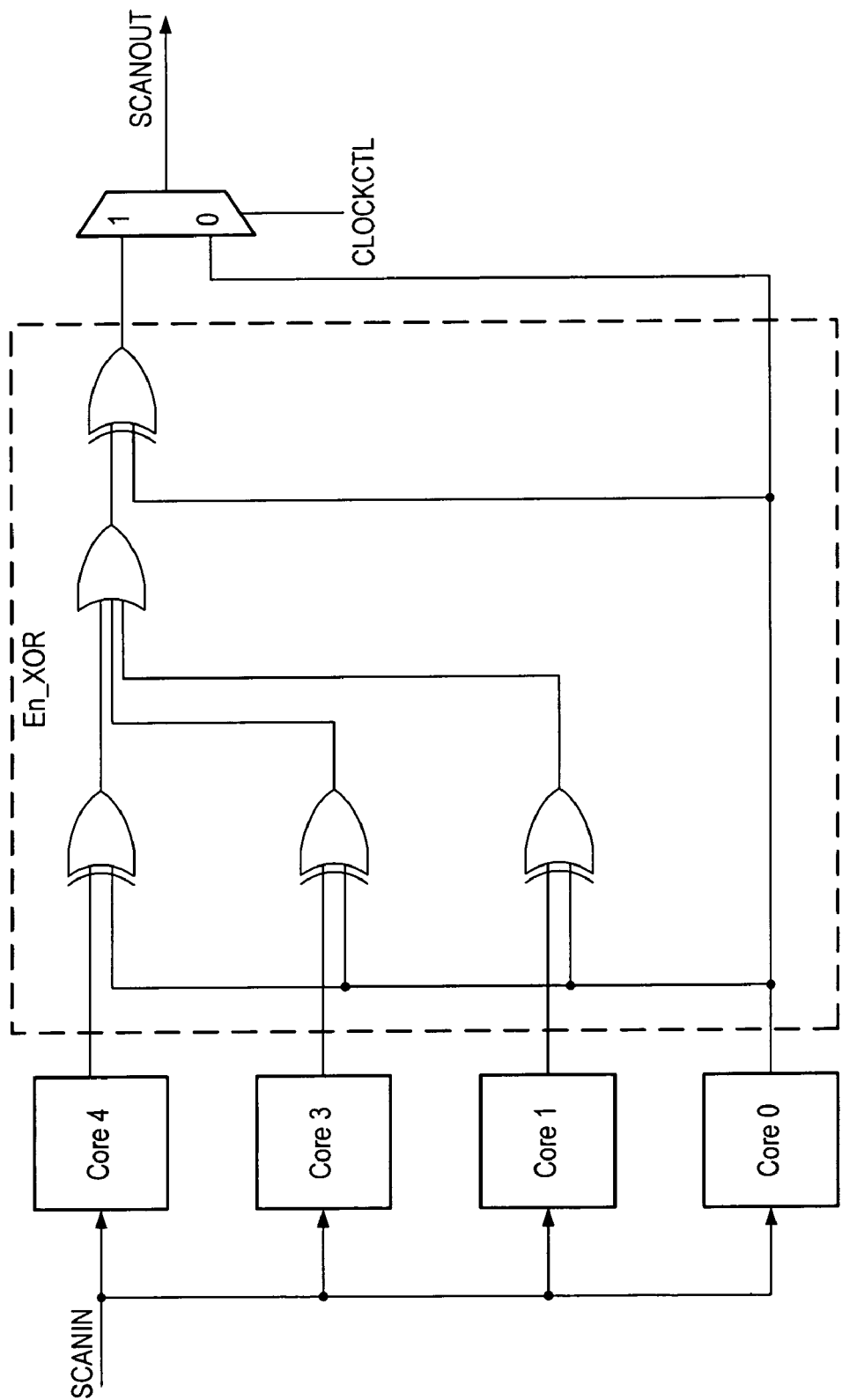
FIG. 10A illustrates one embodiment of a multi-core IC configured for a mode of structural scan testing including concurrent TDM testing of more than two cores concurrently during an ATE strobe window.

In another embodiment, instead of selecting any pair of cores for concurrent testing, as shown in FIGS. 8 and 9, the test mode selector may operate in a TDM mode that tests more than two cores concurrently. FIG. 10A illustrates one embodiment of a consensus circuit, which may be used to compare the results of one of the cores with the results of each other core included in the IC. The output of the this consensus circuit, En_XOR, may be the same as the output of the first core when all cores are in agreement and may be the opposite of the output of the first core when the output of one or more of the other cores disagrees with the output of the first core. Note that although the illustrated embodiment shows only four cores, the En_XOR circuit may be readily extended to operate for any number of cores.

Figure 10B:
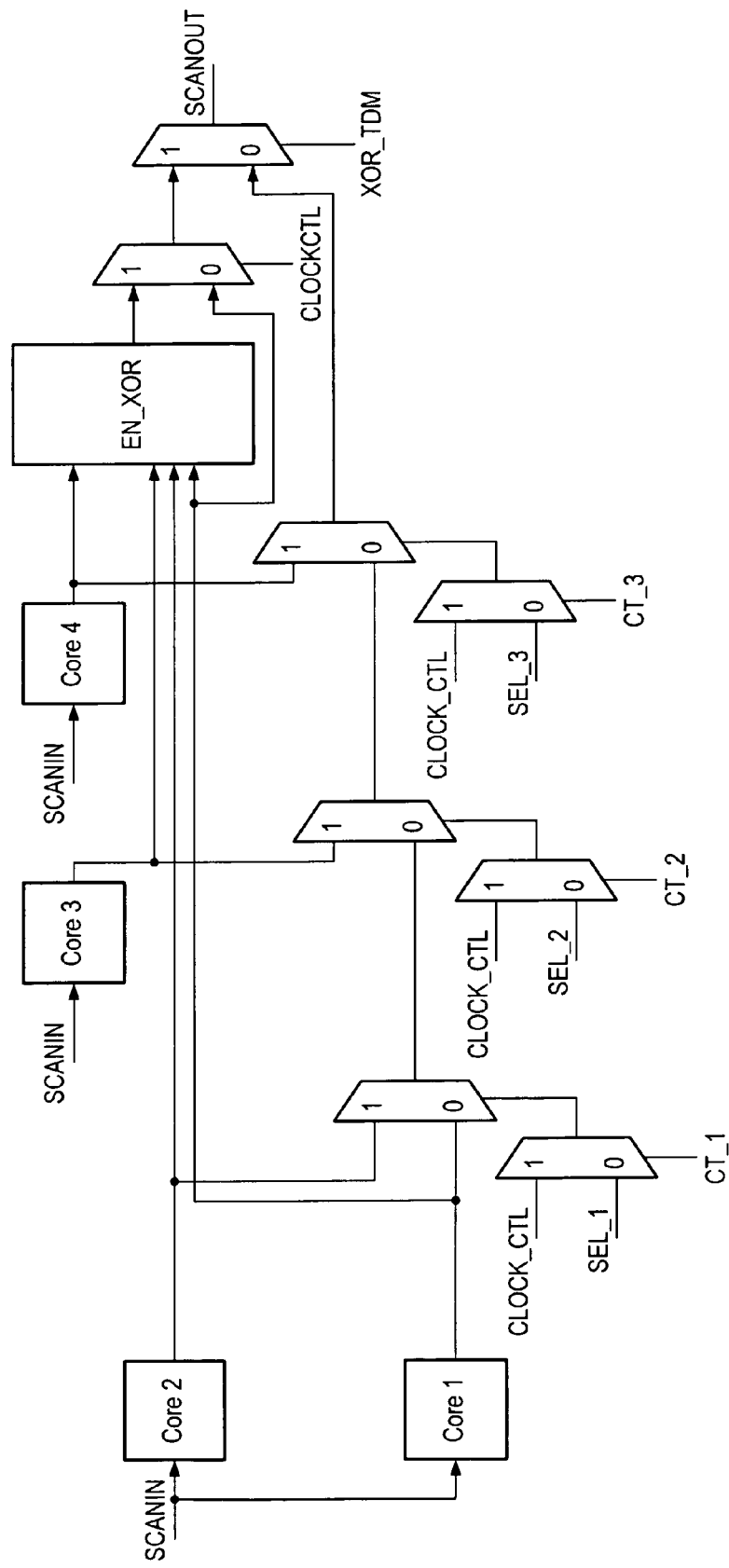
FIG. 10B illustrates one embodiment of a multi-core IC configured to select between multiple modes of structural scan testing including concurrent TDM testing of any pair of cores or TDM testing of more than two cores concurrently during an ATE strobe window.

In one such embodiment, the test mode selector may be designed to output the result for one of the cores (a "first" core) in a first portion of the strobe window. During a second portion of the strobe window, the test mode selector may output a result dependent upon a comparison of the result from each of the remaining cores to the result of the core that was output during the first portion of the strobe window. For example the result from each additional core may be separately XORed with the result from the first core and the result used to provide the complement of the output of the first core when the results of any of the cores disagree. This may be accomplished by the En_XOR block as detailed with regard to FIG. 10A. If any of the other cores disagree with the first core, then the inverted value of the first core result is output during the second portion of the strobe window, which will cause the ATE to note a failure. This test mode may allow more than two cores to be concurrently tested even if the strobe window width is only sufficient for a TDM of two result sets. In some embodiments, the ATE may compare the results of the first core to expected results. This comparison may detect errors resulting from the failure of any of the cores as well as instances in which all cores fail in the same way. In cases where cores other than the first core fail, additional selectivity may be provided to repeat the test for each core pair (such as described for FIG. 8) to determine which core(s) caused the failure. FIG. 10B illustrates one embodiment of a multi-core IC configured to select between multiple modes of structural scan testing including a mode in which all cores are concurrently tested (as described for FIG. 10A) or a selected pair of cores are concurrently tested (as described for FIG. 8).

Figure 11:
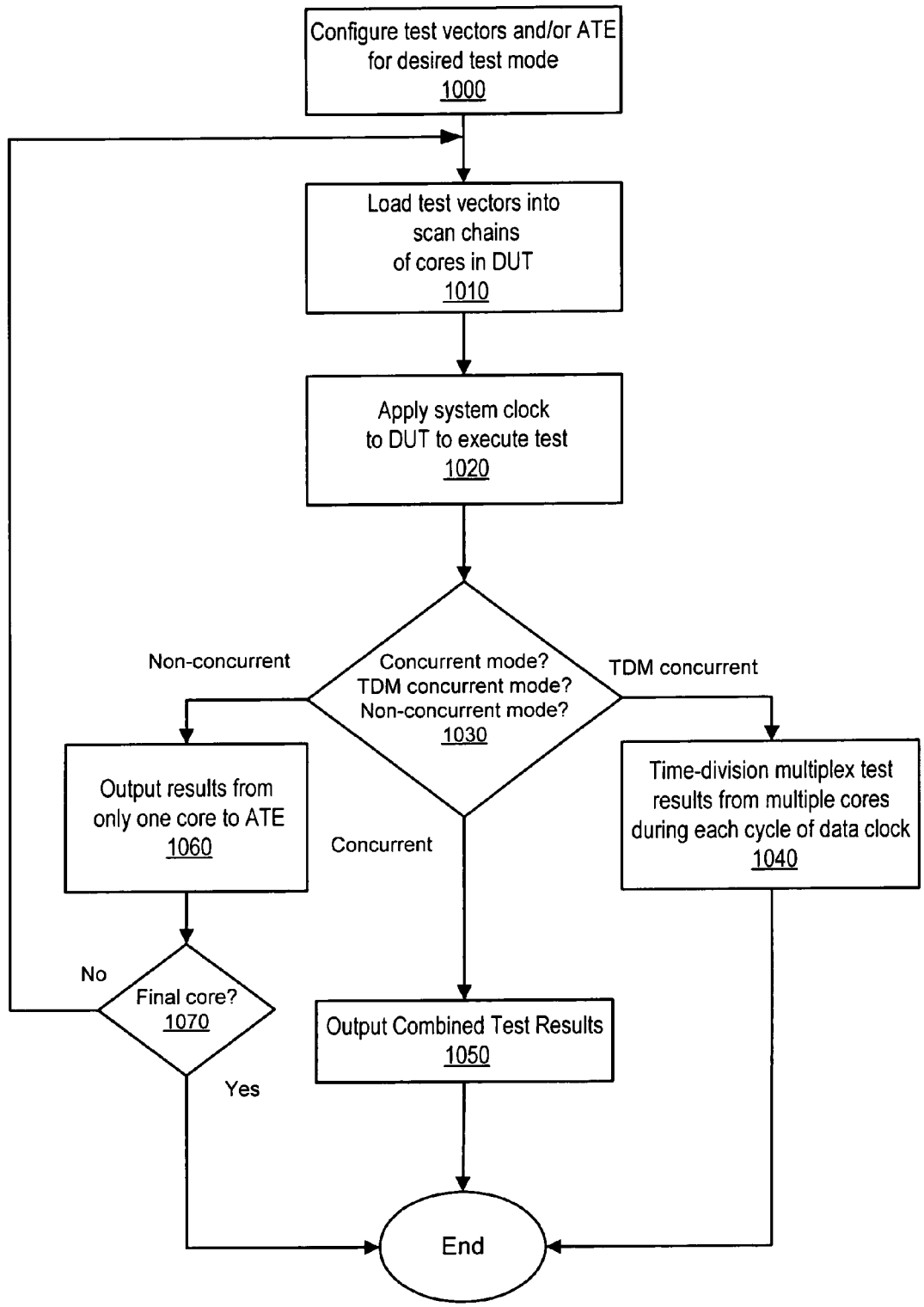
FIG. 11 is a flowchart of a method for selecting a test mode and testing a multi-core IC configured to select between multiple modes of structural scan testing, according to one embodiment.

FIG. 11 is a flowchart of a method for selecting a test mode and testing a multi-core IC configured to select between multiple modes of structural scan testing, according to one embodiment. At block 1000, the test vectors and/or the ATE may be configured for the desired test mode. For example, values for scan chain elements that control the multiplexing of test result outputs may be set. In another embodiment, signals generated by the ATE may be set to directly control test result multiplexing. As shown in block 1010, the appropriately configured test vectors may be clocked into the scan chains of the cores of the DUT. When then test vectors have been loaded, one or more system clock cycles may be applied to the DUT to execute the test, as indicated in block 1020. At decision block 1030, if TDM concurrent test mode is selected, the one bit of the test results on each SCANOUT line from each core of the DUT may be transferred to the ATE during each cycle of the data clock for comparison with expected results using the ATE window strobe mode, as indicated in block 1040. If it is determined at decision block 1030 that concurrent mode is selected, then one bit of the comparison of the results on each SCANOUT line from the cores may be transferred to the ATE during each cycle of the data clock, as indicated at block 1050. In this case the comparison in the ATE may be performed in normal mode. If it is determined at decision block 1030 that non-concurrent mode is selected, then one bit of the results on each SCANOUT line from the particular core that was tested may be transferred to the ATE during each cycle of the data clock, as indicated at block 1060. In this case a check is made at decision block 1070 to determine whether the results are from the last core to be tested, and if this is not the case, the test procedure is repeated on the next core of the DUT to be tested.

Figure 12:
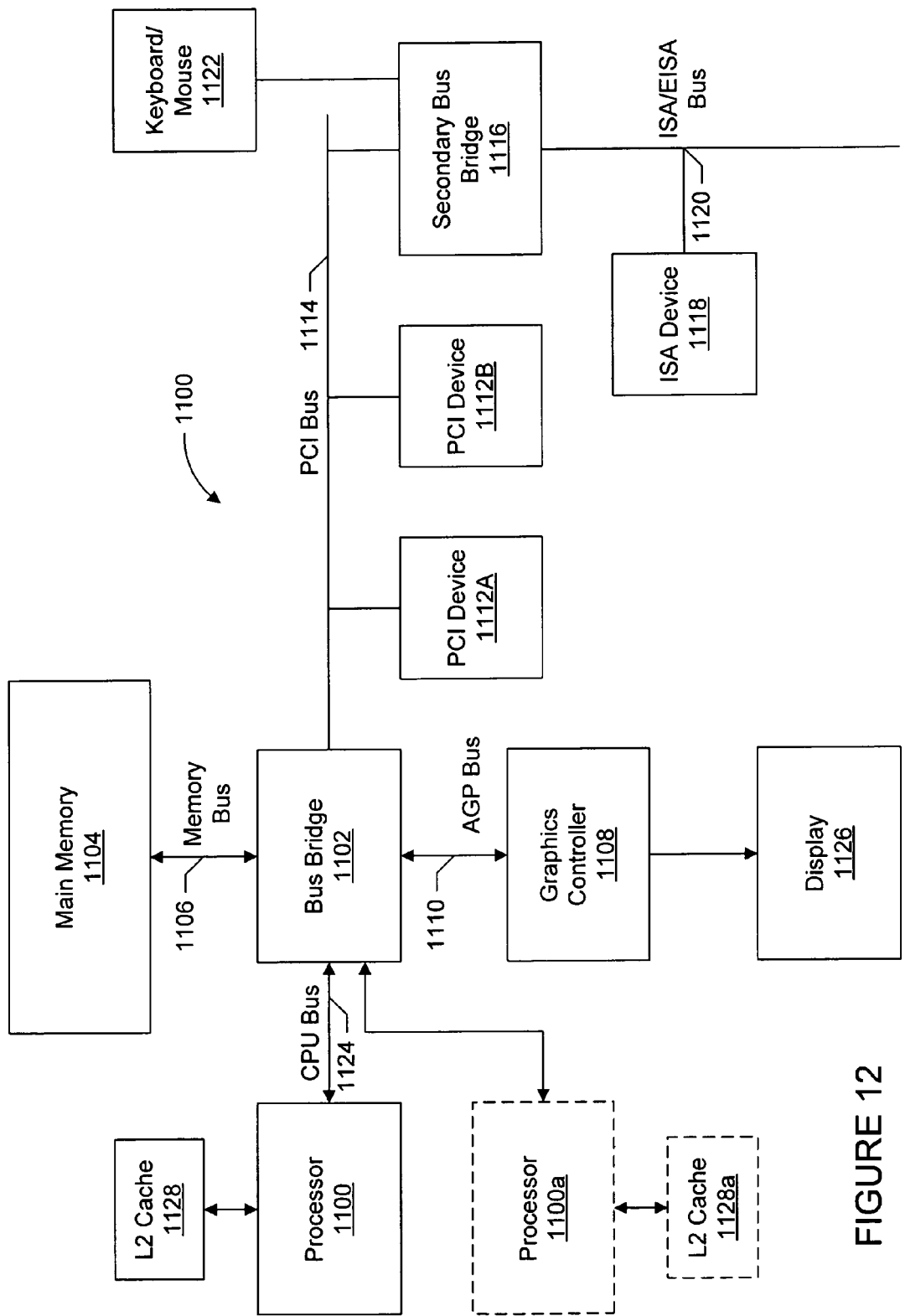
FIG. 12 shows a block diagram of one embodiment of an exemplary computer system, which may include an integrated circuit including multiple logic cores configured to simultaneously test the included cores, according to one embodiment.

FIG. 12 shows a block diagram of one embodiment of a computer system 1100 that includes a microprocessor 1150 coupled to a variety of system components through a bus bridge 1102. Microprocessor 1150 may be a multi-core microprocessor and may include an embodiment of a test mode selector as described above. Other embodiments of a computer system are possible and contemplated. In the depicted system, a main memory 1104 is coupled to bus bridge 1102 through a memory bus 1106, and a graphics controller 1108 is coupled to bus bridge 1102 through an AGP bus 1110. Several PCI devices 1112A-1112B are coupled to bus bridge 1102 through a PCI bus 1114. A secondary bus bridge 1116 may also be provided to accommodate an electrical interface to one or more EISA or ISA devices 1118 through an EISA/ISA bus 1120. In this example, microprocessor 1150 is coupled to bus bridge 1102 through a CPU bus 1124 and to an optional L2 cache 1128. In some embodiments, the microprocessor 100 may include an integrated L1 cache (not shown).

Bus bridge 1102 provides an interface between microprocessor 1150, main memory 1104, graphics controller 1108, and devices attached to PCI bus 1114. When an operation is received from one of the devices connected to bus bridge 1102, bus bridge 1102 identifies the target of the operation (e.g., a particular device or, in the case of PCI bus 1114, that the target is on PCI bus 1114). Bus bridge 1102 routes the operation to the targeted device. Bus bridge 1102 generally translates an operation from the protocol used by the source device or bus to the protocol used by the target device or bus. In some embodiments, bus bridge 1102 may be integrated with the microprocessor 1150.

In addition to providing an interface to an ISA/EISA bus for PCI bus 1114, secondary bus bridge 1116 may incorporate additional functionality. An input/output controller (not shown), either external from or integrated with secondary bus bridge 1116, may also be included within computer system 1100 to provide operational support for a keyboard and mouse 1122 and for various serial and parallel ports. An external cache unit (not shown) may also be coupled to CPU bus 11211 between microprocessor 1150 and bus bridge 1102 in other embodiments. Alternatively, the external cache may be coupled to bus bridge 1102 and cache control logic for the external cache may be integrated into bus bridge 1102. L2 cache 1128 is shown in a backside configuration to microprocessor 1150. It is noted that L2 cache 1128 may be separate from microprocessor 1150, integrated into a cartridge (e.g., slot 1 or slot A) with the microprocessor, or even integrated onto a semiconductor substrate with the microprocessor.

Main memory 1104 is a memory in which application programs are stored and from which microprocessor 1150 primarily executes. A suitable main memory 1104 may include DRAM (Dynamic Random Access Memory). For example, a plurality of banks of SDRAM (Synchronous DRAM) or Rambus DRAM (RDRAM) may be suitable.

PCI devices 1112A-1112B are illustrative of a variety of peripheral devices such as network interface cards, video accelerators, audio cards, hard or floppy disk drives or drive controllers, SCSI (Small Computer Systems Interface) adapters and telephony cards. Similarly, ISA device 1118 is illustrative of various types of peripheral devices, such as a modem, a sound card, and a variety of data acquisition cards such as GPIB or field bus interface cards.

Graphics controller 1108 is provided to control the rendering of text and images on a display 1126. Graphics controller 1108 may embody a typical graphics accelerator generally known in the art to render three-dimensional data structures that can be effectively shifted into and from main memory 1104. Graphics controller 1108 may therefore be a master of AGP bus 1110 in that it can request and receive access to a target interface within bus bridge 1102 to thereby obtain access to main memory 1104. A dedicated graphics bus accommodates rapid retrieval of data from main memory 1104. For certain operations, graphics controller 1108 may further be configured to generate PCI protocol transactions on AGP bus 1110. The AGP interface of bus bridge 1102 may thus include functionality to support both AGP protocol transactions as well as PCI protocol target and initiator transactions. Display 1126 is any electronic display upon which an image or text can be presented. A suitable display 1126 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 1100 may be a multiprocessing computer system including additional microprocessors (e.g., microprocessor 1150*a* shown as an optional component of computer system 1100). Microprocessor 1150*a* may be similar to microprocessor 1150. More particularly, microprocessor 1150*a* may be an identical copy of microprocessor 1150 in one embodiment. Microprocessor 1150*a* may be connected to bus bridge 1102 via an independent bus or may share CPU bus 1124 with microprocessor 1150. Furthermore, microprocessor 100*a* may be coupled to an optional L2 cache 1128*a* similar to L2 cache 1128.

Figure 13:
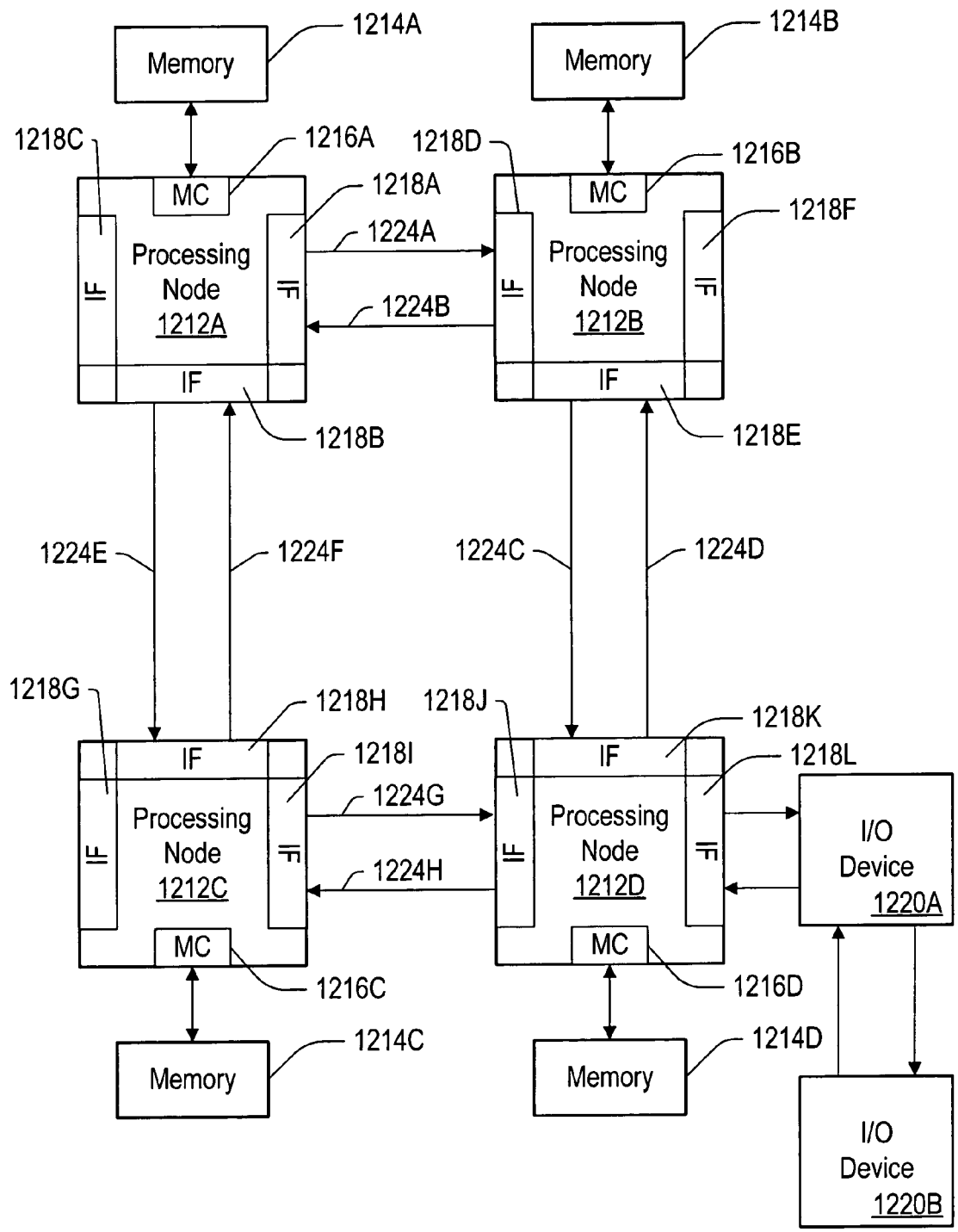
FIG. 13 shows a block diagram of one embodiment of an exemplary computer system, which may include an integrated circuit including multiple logic cores configured to simultaneously test the included cores, according to another embodiment.

Turning now to FIG. 13, another embodiment of a computer system that may include an embodiment of a test mode selector as described above is shown. Other embodiments are possible and contemplated. In one embodiment, computer system includes several processing nodes 1212A, 1212B, 1212C, and 1212D. Each processing node may be a multi-core microprocessor or other multi-core device, and may include a test mode selector as described above. Each processing node is coupled to a respective memory 1214A-1214D via a memory controller 12112A-12112D included within each respective processing node 1212A-1212D. Additionally, processing nodes 1212A-1212D include interface logic used to communicate between the processing nodes 12112A-1212D. For example, processing node 1212A includes interface logic 1218A for communicating with processing node 1212B, interface logic 1218B for communicating with processing node 1212C, and a third interface logic 1218C for communicating with yet another processing node (not shown). Similarly, processing node 1212B includes interface logic 1218D, 1218E, and 1218F; processing node 1212C includes interface logic 1218G, 1218H, and 1218I; and processing node 1212D includes interface logic 1218J, 1218K, and 1218L. Processing node 1212D is coupled to communicate with a plurality of input/output devices (e.g., devices 1220A-1220B in a daisy chain configuration) via interface logic 1218L. Other processing nodes may communicate with other I/O devices in a similar fashion.

Processing nodes 1212A-1212D implement a packet-based link for inter-processing node communication. In the present embodiment, the link is implemented as sets of unidirectional lines (e.g., lines 1224A are used to transmit packets from processing node 1212A to processing node 1212B and lines 1224B are used to transmit packets from processing node 1212B to processing node 1212A). Other sets of lines 1224C-1224H are used to transmit packets between other processing nodes as illustrated in FIG. 13. Generally, each set of lines 1224 may include one or more data lines, one or more clock lines corresponding to the data lines, and one or more control lines indicating the type of packet being conveyed. The link may be operated in a cache coherent fashion for communication between processing nodes or in a non-coherent fashion for communication between a processing node and an I/O device (or a bus bridge to an I/O bus of conventional construction such as the PCI bus or ISA bus). Furthermore, the link may be operated in a non-coherent fashion using a daisy-chain structure between I/O devices as shown. It is noted that a packet to be transmitted from one processing node to another may pass through one or more intermediate nodes. For example, a packet transmitted by processing node 1212A to processing node 1212D may pass through either processing node 1212B or processing node 1212C. Any suitable routing algorithm may be used. Other embodiments of the computer system may include more or fewer processing nodes than the embodiment shown in FIG. 13.

Generally, the packets may be transmitted as one or more bit times on the lines 1224 between nodes. A bit time may be the rising or falling edge of the clock signal on the corresponding clock lines. The packets may include command packets for initiating transactions, probe packets for maintaining cache coherency, and response packets from responding to probes and commands.

Processing nodes 1212A-1212D, in addition to a memory controller and interface logic, may include one or more microprocessors. Broadly speaking, a processing node includes at least one microprocessor and may optionally include a memory controller for communicating with a memory and other logic as desired. More particularly, each processing node 1212A-1212D may include one or more copies of microprocessor 1150. External interface unit may include the interface logic 1218 within the node, as well as the memory controller 1216.

Memories 1214A-1214D may include any suitable memory devices. For example, a memory 1214A-1214D may include one or more RAMBUS DRAMs (RDRAMs), synchronous DRAMs (SDRAMs), static RAM, etc. The address space of computer system 400 is divided among memories 1214A-1214D. Each processing node 1212A-1212D may include a memory map used to determine which addresses are mapped to which memories 1214A-1214D, and hence to which processing node 1212A-1212D a memory request for a particular address should be routed. In one embodiment, the coherency point for an address within the computer system is the memory controller 1216A-1216D coupled to the memory storing bytes corresponding to the address. In other words, the memory controller 1216A-1216D is responsible for ensuring that each memory access to the corresponding memory 1214A-1214D occurs in a cache coherent fashion. Memory controllers 1216A-1216D may include control circuitry for interfacing to memories 1214A-1214D. Additionally, memory controllers 1216A-1216D may include request queues for queuing memory requests.

Interface logic 1218A-1218L may include a variety of buffers for receiving packets from the link and for buffering packets to be transmitted upon the link. The computer system may employ any suitable flow control mechanism for transmitting packets. For example, in one embodiment, each interface logic 1218 stores a count of the number of each type of buffer within the receiver at the other end of the link to which that interface logic is connected. The interface logic does not transmit a packet unless the receiving interface logic has a free buffer to store the packet. As a receiving buffer is freed by routing a packet onward, the receiving interface logic transmits a message to the sending interface logic to indicate that the buffer has been freed. Such a mechanism may be referred to as a "coupon-based" system.

I/O devices 1220A-1220B may be any suitable I/O devices. For example, I/O devices 1220A-1220B may include devices for communicate with another computer system to which the devices may be coupled (e.g., network interface cards or modems). Furthermore, I/O devices 1220A-1220B may include video accelerators, audio cards, hard or floppy disk drives or drive controllers, SCSI (Small Computer Systems Interface) adapters and telephony cards, sound cards, and a variety of data acquisition cards such as GPIB or field bus interface cards. It is noted that the term "I/O device" and the term "peripheral device" are intended to be synonymous herein.

As used herein, the terms "clock cycle" or "cycle" refer to an interval of time in which the various stages of the instruction processing pipelines complete their tasks. Instructions and computed values are captured by memory elements (such as registers or arrays) according to a clock signal defining the clock cycle. For example, a memory element may capture a value according to the rising or falling edge of the clock signal.

Numerous variations and modifications will become apparent to those skilled in the art once the above disclosure is fully appreciated. It is intended that the following claims be interpreted to embrace all such variations and modifications.

Although described in the context of structural testing, the disclosed inventive devices and techniques may be applied to other forms of concurrent testing of multiple cores such as function testing or BIST.

What is claimed is:
1. An integrated circuit, comprising:
a plurality of logic cores; and
scan test hardware coupled to the plurality of logic cores;
wherein the scan test hardware is configured to:
  input scan test data to the plurality of logic cores;
  execute a scan test on the plurality of logic cores simultaneously; and
  output scan test result data from the plurality of logic cores to automated test equipment (ATE) concurrently;

wherein to output scan test result data, the scan test hardware is configured to time-division multiplex (TDM) the scan test result data such that an element of the scan test result data from each of the plurality of logic cores is present on an input channel to the ATE during a strobe window of the ATE.

2. The integrated circuit as recited in claim 1, further comprising one or more hardware functions other than the plurality of logic cores and the scan test hardware.

3. The integrated circuit as recited in claim 2, wherein the one or more hardware functions comprise a communications controller and/or memory controller, and wherein each of the logic cores is a processor core.

4. The integrated circuit as recited in claim 2, wherein the scan test hardware is configured to test the one or more hardware functions and the plurality of logic cores simultaneously.

5. The integrated circuit as recited in claim 2, wherein the scan test hardware is configured to prevent the testing the one or more hardware functions from affecting the scan test result data from the plurality of logic cores.

6. An integrated circuit, comprising:
a plurality of logic cores; and
scan test hardware coupled to the plurality of logic cores;
wherein the scan test hardware is configured to:
select either a concurrent test mode or a non-concurrent test mode from a plurality of test modes, wherein in the concurrent test mode two or more of the logic cores are structurally tested concurrently; and
output scan test result data from the plurality of logic cores to automated test equipment (ATE) concurrently;
wherein to output scan test result data, the scan test hardware is configured to time-division multiplex (TDM) the scan test result data such that an element of the scan test result data from each of the plurality of logic cores is present on an input channel to the ATE during a strobe window of the ATE.

7. The integrated circuit as recited in claim 6, wherein in the non-concurrent test mode, scan test result data is output from only one of the plurality of logic cores per test execution.

8. The integrated circuit as recited in claim 6, wherein in the concurrent test mode, scan test result data from two or more of the logic cores is compared the results of the comparing is output after each test execution.

9. The integrated circuit as recited in claim 6, wherein in the concurrent test mode, scan test result data from each of two or more of the logic cores is output by time division multiplexing during each cycle of a test clock.

10. The integrated circuit as recited in claim 6, further comprising hardware functions other than the plurality of logic cores and the scan test hardware, wherein one or more of the plurality of test modes comprises testing said hardware functions.

11. A method, comprising:
inputting scan test data to a plurality of logic cores comprised within a single integrated circuit;
executing a scan test on the plurality of logic cores simultaneously; and
outputting scan test result data from the plurality of logic cores to automated test equipment (ATE) concurrently;
wherein said outputting comprises time-division multiplexing the scan test result data such that an element of the scan test result data from each of the plurality of logic cores is present on an input channel to the ATE during a strobe window of the ATE.

12. The method as recited in claim 11, wherein the integrated circuit further comprises one or more hardware functions other than the plurality of logic cores.

13. The method as recited in claim 12, wherein the one or more hardware functions comprise a communications controller and/or memory controller, and wherein each of the logic cores is a processor core.

14. The method as recited in claim 12, further comprising testing the one or more hardware functions and the plurality of logic cores simultaneously.

15. The method as recited in claim 12, further comprising preventing testing the one or more hardware functions from affecting the scan test result data from the plurality of logic cores.

16. A method comprising:
selecting a test mode comprised in a plurality of test modes comprising one or more concurrent and one or more non-concurrent test modes in which to test one or more of a plurality of logic cores comprised in an integrated circuit;
testing one or more of the plurality of logic cores in the selected test mode; and
outputting test result data from the one or more of the plurality of logic cores in accordance with the selected test mode to automated test equipment (ATE) concurrently;
wherein said outputting comprises time-division multiplexing the scan test result data such that an element of the scan test result data from each of the plurality of logic cores is present on an input channel to the ATE during a strobe window of the ATE.

17. The method as recited in claim 16, wherein the plurality of test modes comprises a non-concurrent test mode, wherein scan test result data is output from only one of the plurality of logic cores after each test execution.

18. The method as recited in claim 16, wherein the plurality of test modes comprises a concurrent test mode, wherein scan test result data from two or more of the plurality of logic cores is compared and wherein the results of the comparing are output after each test execution.

19. The method as recited in claim 16, wherein the plurality of test modes comprises a TDM concurrent test mode, wherein scan test result data from two or more of the plurality of logic cores is output by time division multiplexing during each cycle of a test clock.

20. The method as recited in claim 16, wherein the integrated circuit comprises hardware functions other than the plurality of logic cores and wherein one or more of the plurality of test modes comprises testing said hardware functions.

21. A test system, comprising:
automated test equipment (ATE); and
a device under test (DUT) coupled to the ATE, and comprising:
a plurality of logic cores; and
scan test hardware coupled to the plurality of logic cores and configured to:
input scan test data to the plurality of logic cores;
execute a scan test on the plurality of logic cores simultaneously; and
output scan test result data from the plurality of logic cores to automated test equipment (ATE) concurrently;
wherein to output scan test results, the scan test hardware is configured to time-division multiplex the scan test result data such that an element of the scan test result data from each of the plurality of logic cores is present on an input channel to the ATE during a strobe window of the ATE.

22. The system as recited in claim 21, further comprising one or more hardware functions other than the plurality of logic cores and the scan test hardware.

23. The system as recited in claim 22, wherein the one or more hardware functions comprise a communications controller and/or memory controller, and wherein each of the logic cores is a processor core.

24. The system as recited in claim 22, wherein the scan test hardware is configured to test the one or more hardware functions and the plurality of logic cores simultaneously.

25. The system as recited in claim 22, wherein the scan test hardware is configured to prevent the testing the one or more hardware functions from affecting the scan test result data from the plurality of logic cores.

26. A test system, comprising:
automated test equipment (ATE); and
a device under test (DUT) coupled to the ATE, and comprising:
a plurality of logic cores; and
structural scan test hardware coupled to the plurality of logic cores;
wherein the structural scan test hardware is configured to:
select a concurrent or non-concurrent test mode comprised in a plurality of test modes; and
output scan test result data from the plurality of logic cores to automated test equipment (ATE) concurrently;
wherein to output scan test results, the scan test hardware is configured to time-division multiplex the scan test result data such that an element of the scan test result data from each of the plurality of logic cores is present on an input channel to the ATE during a strobe window of the ATE.

27. The system as recited in claim 26, wherein the plurality of test modes comprises one or more non-concurrent test modes, wherein scan test result data is output from only one of the plurality of logic cores after each test execution.

28. The system as recited in claim 26, wherein the plurality of test modes comprises a concurrent test mode, wherein scan test result data from two or more of the plurality of logic cores is compared and wherein the results of the comparing is output after each test execution.

29. The system as recited in claim 26, wherein the plurality of test modes comprises a TDM concurrent test mode, wherein scan test result data from two or more of the plurality of logic cores is output by time division multiplexing during each cycle of a test clock.

30. The system as recited in claim 26, comprising hardware functions other than the plurality of logic cores and the structural scan test hardware, wherein one or more of the plurality of test modes comprises testing said hardware functions.

* * * * *